(12) United States Patent
Lu et al.

(10) Patent No.: US 6,420,101 B1
(45) Date of Patent: Jul. 16, 2002

(54) METHOD OF REDUCING POST-DEVELOPMENT DEFECTS IN AND AROUND OPENINGS FORMED IN PHOTORESIST BY USE OF NON-PATTERNED EXPOSURE

(75) Inventors: Zhijian Lu, Poughkeepsie; Alan Thomas, Hughsonville; Alois Gutmann; Kuang Jung Chen, both of Poughkeepsie; Margaret C. Lawson, Millbrook, all of NY (US)

(73) Assignees: Infineon Technologies A G, Munich (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 09/598,376

(22) Filed: Jun. 21, 2000

(51) Int. Cl.[7] .................................. G03F 7/20
(52) U.S. Cl. .................. 430/326; 430/296; 430/327; 430/328; 430/394; 430/967
(58) Field of Search .................. 430/326, 327, 430/328, 331, 296, 967, 394

(56) References Cited

U.S. PATENT DOCUMENTS

| 4,931,380 A | * | 6/1990 | Owens et al. | 430/327 |
| 5,468,595 A | * | 11/1995 | Livesay | 430/328 |
| 5,789,140 A | * | 8/1998 | Chou et al. | 430/328 |
| 5,905,019 A | * | 5/1999 | Obszarny | 430/327 |

* cited by examiner

Primary Examiner—Richard L. Schilling
(74) Attorney, Agent, or Firm—Stanton Braden

(57) ABSTRACT

In the exposure and development of available deep ultraviolet (DUV) sensitive photoresist it has been observed that following the standard prior art methods of exposure and development results in a high density of undesirable pieces of components of the photoresist material, Blob Defects, remaining on the semiconductor substrate (body). A method of exposing and developing the photoresist material which results in a reduced incidence of these Blob Defects consists of introducing a low level uniform flood exposure of light in addition to the commonly used exposure to patterned light, followed by standard development. The flood exposure is in the range of 5 to 50% of the dose-to-clear for a non-patterned exposure.

4 Claims, 3 Drawing Sheets

METHOD OF REDUCING POST-DEVELOPMENT DEFECTS IN AND AROUND OPENINGS FORMED IN PHOTORESIST BY USE OF NON-PATTERNED EXPOSURE

CROSS-REFERENCE TO RELATED APPLICATIONS

This application is related to U.S. Serial No. 09/598,374, which is entitled "METHOD OF REDUCING POST-DEVELOPMENT DEFECTS IN AND AROUND OPENINGS FORMED IN PHOTORESIST BY USE OF MULTIPLE DEVELOPMENT/RINSE CYCLES". Both applications have one common inventor, a common assignee, and are being filed concurrently.

FIELD OF THE INVENTION

This invention relates to semiconductor fabrication lithography, lithographic resist, and the development of same, and to a method for reducing the incidence of undesired post-development defects, denoted as "Blob Defects", which may remain on a surface of a semiconductor wafer being processed after the development of the resist.

BACKGROUND OF THE INVENTION

As the minimum feature size of semiconductor devices has become smaller and smaller, new techniques, equipment and materials have been developed to meet the needs and requirements of those practicing the art of semiconductor fabrication. This has been especially true in the area of lithography, or more specifically, photolithography. As the size of the features of the semiconductor device have decreased from the thousandths of an inch (25000 nm) employed in initial semiconductor devices, to features with sizes of 130 nm, or less, the wavelength of the light employed to expose the photoresist has decreased from around 500 nm to 248 nm or less. This decrease in optical wavelength has required the development of new light sources, new equipment to project the image of a mask onto the surface of a semiconductor wafer (body), and new photoresist materials and photoresist developer materials. Present efforts are concentrated on the use of 248 nm deep ultraviolet (DUV) light. Several DUV sensitive photoresist materials have been developed and are in use in the industry. The characteristics important in a photoresist material include, among others, cost, sensitivity, adherence to the films in use, purity, reproducibility of characteristics, and most important, the ability to achieve a low density of photolithographic related defects.

DUV photoresist materials have been identified, and are in use around the world, which demonstrate most, but not all of these important characteristics. One of the required characteristics which has not been adequately demonstrated is the ability to achieve a low density of photolithographic related defects. Typically, most of the DUV photoresist materials which are in common use exhibit a class of post-development defects which are defined as "Blob Defects", in which fragments, pieces, or particles of the original components of the photoresist material, which should have been removed, remain in and around small openings in the photoresist after the photoresist has been exposed and developed, potentially blocking or partially blocking such openings. Such fragments of photoresist interfere with etching of the material under the photoresist, or with ion implantation or deposition through these openings in the photoresist. Such Blob Defects have been observed on semiconductor wafers being processed with all available DUV photoresists, regardless of the resist chemistry. The observation has been that the better the resist contrast and surface inhibition, the higher the Blob Defect density.

Modern photoresist materials are typically developed using a technique known as Puddle Development. The use of this technique is well known in the field of semiconductor lithography. This prior art method comprises the following steps. A semiconductor wafer which has been prepared with photoresist material and which has been exposed to the desired pattern of light is first given a post exposure bake and then cooled to near ambient room temperature. The photoresist is then developed as follows. The semiconductor wafer is placed on a spinner head and rotated at a high speed while a small amount of liquid, either developer solution or deionized water, is dispensed onto the surface of the semiconductor wafer to pre-wet the surface of the photoresist. The high speed of rotation generates sufficient centrifugal force to cause the liquid to be thrown off of the periphery of the semiconductor wafer as it is dispensed onto the central portion of the wafer. No liquid remains on the surface of the semiconductor wafer. The speed of rotation of the semiconductor wafer is then reduced to a lower value and a quantity of developer solution is dispensed onto the surface of the semiconductor wafer. The lower speed of rotation is such that centrifugal force spreads the developer solution out to the periphery of the semiconductor wafer, but the centrifugal force is insufficient to overcome the surface tension of the developer solution, and the developer solution is not thrown from the surface of the semiconductor wafer but remains as a pool, or puddle, on the surface. The puddle of developer solution is allowed to remain on the surface of the semiconductor wafer for a time sufficient to allow complete development of the exposed photoresist material. The speed of rotation is then increased to a higher value at which centrifugal force will cause the developer solution to be thrown from the surface-of the semiconductor wafer. The semiconductor wafer is then rinsed and dried, completing the development of the photoresist.

It is known in the art to use multiple development steps in the development of photoresist material.

The selection of photoresist for contact hole lithography has become a compromise between defect density and lithographic performance. Blob defects have become a limiting factor in resist selection and yield enhancement.

It is desired to reduce the density of Blob Defects in the lithographic processing of semiconductor devices.

SUMMARY OF THE INVENTION

We have found that the fabrication of semiconductor devices can be improved and the density of a particular type of processing defect can be reduced by making changes to the method by which the device patterns are transferred to a photosensitive resist material (photoresist) which is subsequently used to define the device structure. The present inventive method of exposing photoresist employs two exposures of the photoresist to light, one an exposure to non-patterned light, and one an exposure to patterned light.

When certain types of photoresist material are exposed to only patterned light, and the photoresist is subsequently developed, it is found that particles of the components of the photoresist, denoted as "Blob Defects", can remain in and around the openings created in the layer of photoresist. The photoresist material is composed of various components, including a base polymer and photosensitive elements. The Blob Defects appear to be an aggregation of hydrophobic materials having low solubility in the photoresist developer solution. The mechanisms and dynamics by which these Blob Defects are formed and adhere to the structures being processed are not completely understood.

We have observed that by exposing the photoresist to a non-patterned flood exposure of light which is of insufficient intensity and time duration to cause development of the entire thickness of photoresist, in addition to the patterned exposure, the density of such defects is reduced. In one particular experiment a reduction of the density of Blob Defects by a factor of 17, from a density of 35 to 2 defects per sq. cm., was observed.

It has been found that the preferred range of the intensity of the flood exposure is 10 to 50%, or greater, of the "dose-to-clear" for a non-patterned exposure. "Dose-to-clear" is defined as the exposure which results in a complete removal of a photoresist layer when exposed to developer solution. The intensity of the patterned exposure associated with a flood exposure is adjusted to minimize pattern degradation.

The flood exposure of the photoresist results in only a portion of the thickness of the photoresist being removed in areas where no patterned exposure takes place. For a nominal photoresist thickness of 500 nm, it has been found advantageous to adjust the flood exposure so that several tens of nm of photoresist is removed from the area where no patterned exposure is made.

Viewed from a first aspect, the present invention is directed to a method of exposing a layer of photoresist material to reduce the incidence of Blob Defects. The method comprises the steps of illuminating a surface of the layer of photoresist material with non-patterned light with a total exposure insufficient to result in complete removal of the layer of photoresist material during a subsequent development process, and illuminating the surface of the layer of photoresist material with a patterned intensity of light with a total exposure sufficient to result in the complete removal of the layer of photoresist material in regions specified in the pattern during the subsequent development process.

Viewed from a second aspect, the present invention is directed to a method of exposing a layer of photoresist material to reduce the incidence of Blob Defects. The method comprises the steps of coating the surface of a semiconductor body with a layer of photoresist material having a top surface, illuminating the top surface of the layer of photoresist material with a non-patterned uniform exposure of light having an exposure level less than a threshold exposure level required for exposure of said layer of photoresist material to create a desired pattern therein, and illuminating the top surface of the layer of photoresist material with a patterned exposure of light having an exposure level greater than the exposure level of the non-patterned uniform exposure of light and at least an exposure level sufficient to generate a desired pattern in the layer of photoresist material.

Viewed from a third aspect the present invention is directed to a method of exposing an x-ray sensitive layer of x-ray resist material to reduce the incidence of Blob Defects. The method comprises the steps of illuminating a surface of the layer of x-ray resist material with non-patterned x-rays with a total exposure insufficient to result in complete removal of the layer of x-ray resist material during a subsequent development process, and illuminating the surface of the layer of x-ray resist material with a patterned intensity of x-rays with a total exposure sufficient to result in the complete removal of the layer of x-ray resist material in regions specified in the pattern during the subsequent development process.

Viewed from a fourth aspect the present invention is directed to a method of exposing an electron beam sensitive layer of e-beam resist material to reduce the incidence of Blob Defects. The method comprises the steps of illuminating a surface of the layer of e-beam resist material with a non-patterned electron beam with a total exposure insufficient to result in complete removal of the layer of e-beam resist material during a subsequent development process, and illuminating the surface of the layer of e-beam resist material with a patterned electron beam with a total exposure sufficient to result in the complete removal of the layer of e-beam resist material in regions specified in the pattern during the subsequent development process.

Viewed from a fifth aspect the present invention is directed to a method of exposing a layer of ion beam sensitive resist material to reduce the incidence of Blob Defects. The method comprises the steps of illuminating a surface of the layer of the resist material with a non-patterned ion beam with a total exposure insufficient to result in complete removal of the layer of the resist material during a subsequent development process, and illuminating the surface of the layer of the resist material with a patterned ion beam with a total exposure sufficient to result in the complete removal of the layer of the resist material in regions specified in the pattern during the subsequent development process.

The present invention will be better understood from the following more detailed description taken with the accompanying drawings and claims.

DETAILED DESCRIPTION

Figure 1:
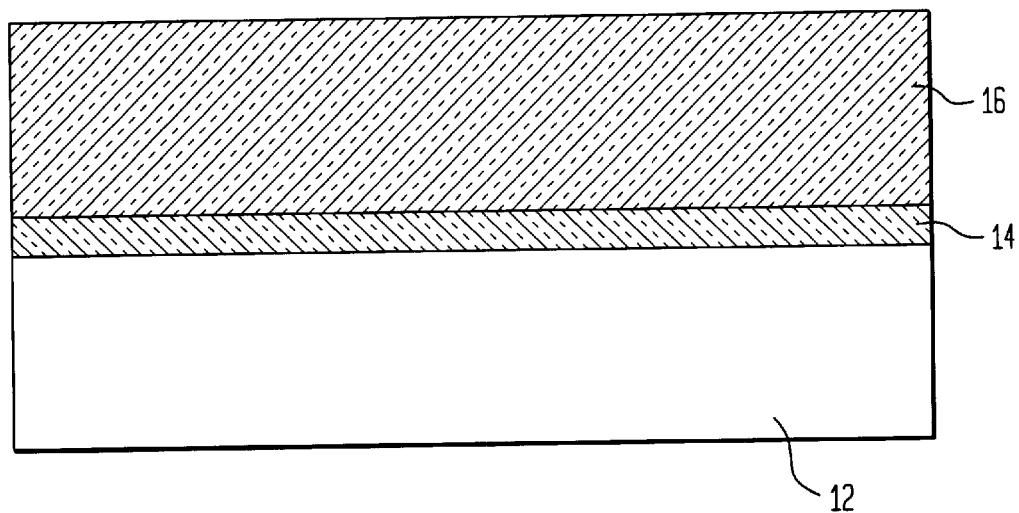
FIGS. 1–4 show a semiconductor body at various points in the inventive process of this invention.

Referring now to FIG. 1, there is shown a sectional view of a semiconductor structure 10 comprising a semiconductor body 12 upon which has been deposited an anti-reflection coating (ARC) 14, and upon this ARC 14 has been deposited a photoresist layer 16. It is desired to expose selected areas of the photoresist layer 16 to a pattern of light which will result in these selected areas of the photoresist layer 16 being removed from the semiconductor structure 10 when the photoresist layer 16 is developed, and to do this exposure/development process in such a manner as to reduce the density of Blob Defects which may remain on the semiconductor structure 10 after the exposed photoresist is developed and removed from the semiconductor structure 10.

The subject of this invention is a novel method of exposing the photoresist layer 16 to light in a manner as to reduce the density of Blob Defects. This is accomplished by combining a patterned exposure of light with a non-patterned flood exposure.

Figure 2:
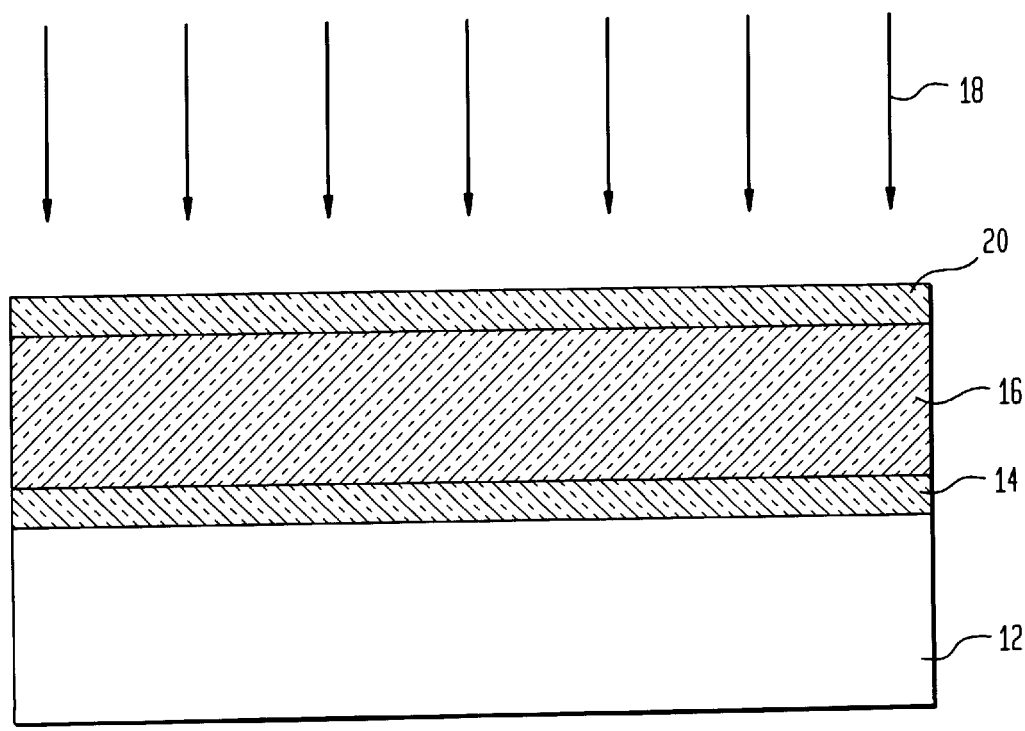

FIG. 2 shows the photoresist layer 16 being exposed to non-patterned light 18. This results in a narrow layer 20 of the photoresist layer 16 being chemically changed or modified so that the layer 20 will be dissolved and removed when the photoresist layer 16 is exposed to a photoresist developer solution.

Figure 3:
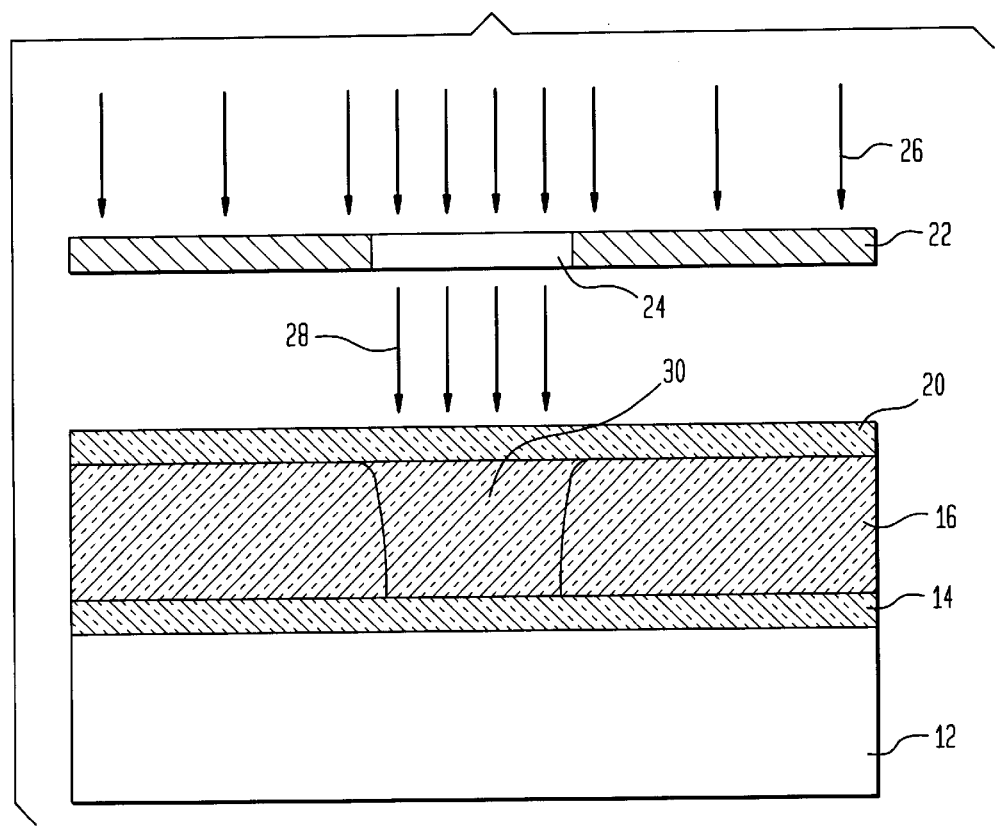

FIG. 3 shows the photoresist layer 16 being exposed to patterned light 28. A patterned opaque mask 22 with a transparent portion 24 is illuminated by non-patterned light 26, with patterned light 28 being transmitted through the transparent portion 24 and impinging upon photoresist 16. This results in a portion 30 of photoresist 16 being changed or modified so that the portion 30 will be dissolved and removed when subjected to a photoresist developer solution.

Figure 4:
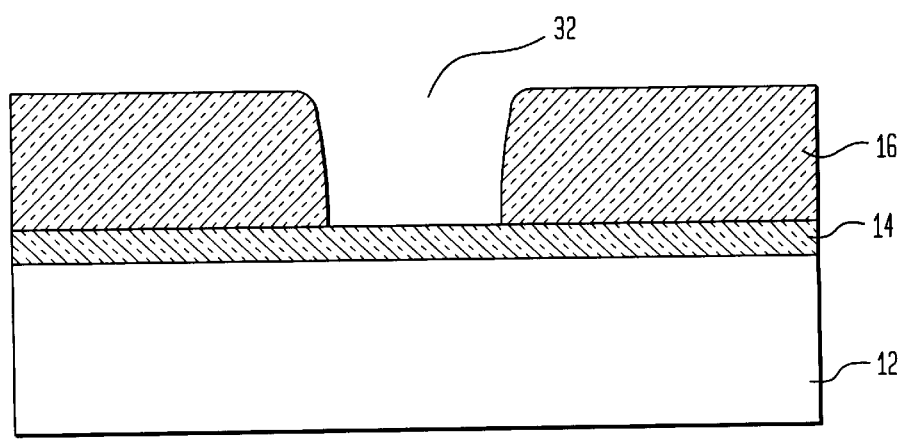

FIG. 4 shows the semiconductor structure 10 with mask 22 removed and after the photoresist layer 16 has been exposed to photoresist developer solution which has dissolved portions 20 and 30 of the photoresist layer 16 which were exposed to light. This results in a portion of photoresist 16 being removed and an opening (window) 32 in the remaining photoresist layer 16.

Figure 5:
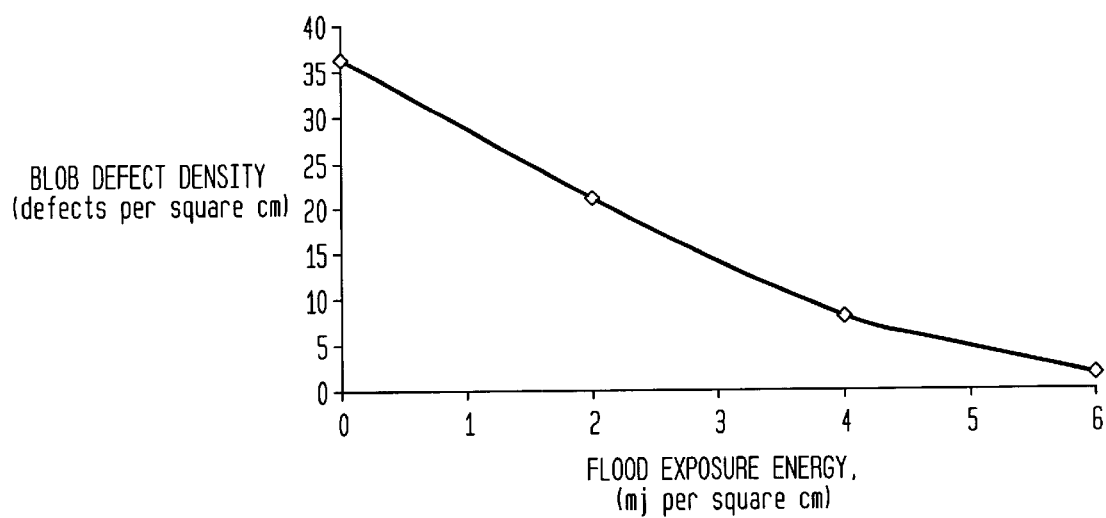
FIG. 5 shows a graphical plot of Blob Defect Density as a function of the Flood Exposure.

FIG. 5 is a graphical plot with the density of Blob Defects, as measured in defects per sq. cm., on the y-axis, and the total energy of the flood exposure of light, as measured in mj per sq. cm., on the x-axis. The plot shows that for this particular set of materials and conditions, the density of Blob Defects was reduced from a value of 36 per sq. cm. for no flood exposure, to a value of 2 per sq. cm for a flood exposure intensity of 6 mj per sq. cm. It is expected that for different materials and conditions, a greater or lesser degree of defect reduction would be observed.

Although it is not completely understood why this reduction in defect density is achieved, it is believed possible that the flood exposure and the resulting dissolution of the surface of the photoresist during the development process modifies the surface of the remaining photoresist, making it more hydrophilic and less hydrophobic, so that dissolved photoresist is less likely to redeposit on the surface, and will be simply washed away with the developer solution.

It is understood that the particular structures, materials and processes described are merely illustrative of the general principles of the invention. Various modifications are possible without departing from the spirit and scope of the invention. For example, the ARC layer may or may not be used. Resist materials other than photoresist may be used, in particular, electron beam (e-beam) sensitive resist or x-ray sensitive resist may be used. Exposure of the resist by means other than light may be used, in particular exposure of the resist by electron beams, ion beams or x-ray beams. Various methods of photoresist development other that which dissolves the exposed photoresist may be used. Furthermore, the concepts described herein may be applied to all types of devices and structures where it is necessary to create an opening in a resist layer and to minimize the amount of undesirable resist material remaining on a surface or in an opening in the resist after the resist material has been removed from the opening.

What is claimed is:

1. A method of exposing an x-ray sensitive layer of x-ray resist material to reduce the incidence of Blob Defects comprising the steps of:

illuminating a surface of the layer of x-ray resist material with non-patterned x-rays with a total exposure insufficient to result in complete removal of the layer of x-ray resist material during a subsequent development process; and illuminating the surface of the layer of x-ray resist material with a patterned intensity of x-rays with a total exposure sufficient to result in the complete removal of the layer of x-ray resist material in regions specified in the pattern during the subsequent development process.

2. The method of claim 8 further comprising the step of developing the layer of x-ray resist.

3. A method of exposing a layer of ion beam sensitive resist material to reduce the incidence of Blob Defects comprising the steps of:

illuminating a surface of the layer of the resist material with a non-patterned ion beam with a total exposure insufficient to result in complete removal of the layer of the resist material during a subsequent development process; and illuminating the surface of the layer of the resist material with a patterned ion beam with a total exposure sufficient to result in the complete removal of the layer of the resist material in regions specified in the pattern during the subsequent development process.

4. The method of claim 3 further comprising the step of developing the ion beam sensitive resist.

* * * * *